(12) United States Patent
Park

(10) Patent No.: US 12,274,000 B2
(45) Date of Patent: Apr. 8, 2025

(54) FLEXIBLE PRINTED CIRCUIT BOARD, COF MODULE, AND ELECTRONIC DEVICE COMPRISING THE SAME

(71) Applicant: LG INNOTEK CO., LTD., Seoul (KR)

(72) Inventor: Sang Hun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 230 days.

(21) Appl. No.: 17/820,942

(22) Filed: Aug. 19, 2022

(65) Prior Publication Data

US 2023/0057668 A1 Feb. 23, 2023

(30) Foreign Application Priority Data

Aug. 20, 2021 (KR) ........................ 10-2021-0110421

(51) Int. Cl.
*H05K 1/11* (2006.01)
*H05K 1/18* (2006.01)

(52) U.S. Cl.
CPC .............. *H05K 1/111* (2013.01); *H05K 1/118* (2013.01); *H05K 1/189* (2013.01); *H05K 2201/09227* (2013.01); *H05K 2201/10128* (2013.01)

(58) Field of Classification Search
CPC .................... H05K 1/111; H05K 1/118; H05K 2201/10128; H05K 2201/09227; H05K 1/189; H05K 3/28; H05K 2201/10681; H01L 23/49838; H01L 23/4985
See application file for complete search history.

(56) References Cited

U.S. PATENT DOCUMENTS

| 9,691,791 | B2 | 6/2017 | Jeon et al. | |
|---|---|---|---|---|
| 2006/0113648 | A1* | 6/2006 | Chung | H01L 24/06 257/E23.021 |
| 2006/0131064 | A1* | 6/2006 | Hagiwara | H01L 23/4985 174/250 |
| 2007/0012774 | A1* | 1/2007 | Cho | H05K 1/0216 235/435 |
| 2007/0126090 | A1* | 6/2007 | Sasaki | H01L 23/4985 257/668 |

(Continued)

FOREIGN PATENT DOCUMENTS

KR 10-2008-0053781 A 6/2008
KR 10-2016-0015479 A 2/2016

*Primary Examiner* — Steven T Sawyer
(74) *Attorney, Agent, or Firm* — SALIWANCHIK, LLOYD & EISENSCHENK

(57) ABSTRACT

A flexible printed circuit board according to an embodiment includes a substrate, a circuit pattern disposed on the substrate, and a protective layer on the circuit pattern, wherein the substrate includes a chip mounting region, the circuit pattern includes a first circuit pattern and a second circuit pattern connected to a chip of the chip mounting region, the second circuit pattern includes a plurality of second wiring portions and a third pad portion and a fourth pad portion connected to the second wiring portion, the second wiring portion includes a first wiring region connected to the fourth pad portion and a second wiring region bent in the first wiring region, a first space of the first wiring region is greater than a second space of the second wiring region, and a length of the first wiring region is 100 μm or more.

17 Claims, 14 Drawing Sheets

(56) References Cited

U.S. PATENT DOCUMENTS

| | | | |
|---|---|---|---|
| 2008/0137016 A1 | 6/2008 | Kim et al. | |
| 2010/0072607 A1* | 3/2010 | Chung | H01L 23/3157 257/E23.06 |
| 2013/0186680 A1* | 7/2013 | Ha | H05K 3/0052 205/291 |
| 2014/0131889 A1* | 5/2014 | Kim | H01L 23/4985 174/254 |
| 2014/0138123 A1* | 5/2014 | Chen | H05K 3/28 174/251 |
| 2015/0311148 A1* | 10/2015 | Jung | H01L 23/49838 361/767 |
| 2016/0270234 A1* | 9/2016 | Ahn | H05K 1/189 |
| 2018/0068940 A1* | 3/2018 | Oh | H01L 25/18 |
| 2021/0191482 A1* | 6/2021 | Zhou | H05K 1/111 |

\* cited by examiner

FLEXIBLE PRINTED CIRCUIT BOARD, COF MODULE, AND ELECTRONIC DEVICE COMPRISING THE SAME

CROSS-REFERENCE TO RELATED APPLICATIONS

This application claims priority under 35 U.S.C. 119 and 35 U.S.C. 365 to Korean Patent Application No. 10-2021-0110421 (filed on Aug. 20, 2021), which is hereby incorporated by reference in its entirety.

TECHNICAL FIELD

An embodiment relates to a flexible printed circuit board, a COF module, and an electronic device including the same. In detail, the flexible printed circuit board may be a flexible printed circuit board for COF.

BACKGROUND ART

In recent years, various electronic products have become thinner, smaller and lighter. Accordingly, various researches are being conducted in order to mount a semiconductor chip at a high density in a narrow region of an electronic product.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases).

A chip on film (COF) is a method in which a semiconductor chip is mounted on a flexible printed circuit board in the form of a thin film. For example, the semiconductor chip may be an integrated circuit (IC) chip or a large-scale integrated circuit (LSI) chip.

Meanwhile, the chip may be connected to an external PCB and a display panel through a wiring electrode. For example, a pad portion may be disposed on one end and the other end of the wiring electrode, respectively, one pad portion may be electrically connected to a terminal of the chip, and the other pad portion may be connected to terminals of the PCB and the display panel. Accordingly, the chip, the PCB, and the display panel may be electrically connected through the COF, and a signal may be transmitted to the display panel through the wiring electrode.

In this case, the pad portion of the wiring electrode and the terminal of the chip, the terminal of the PCB, and the terminal of the display panel may be electrically connected through a conductive adhesive.

In the conductive adhesive, balls having conductivity may be dispersed in a resin. Accordingly, when the conductive adhesive is disposed between the wiring electrodes, adjacent wiring electrodes are connected to each other by conductive balls of the conductive adhesive, which may cause a short-circuit.

Therefore, a flexible printed circuit board having a new structure that can solve the above problems are required.

SUMMARY

Technical Problem

An embodiment is directed to providing a flexible printed circuit board having improved reliability, a COF module, and an electronic device including the same.

Technical Solution

A flexible printed circuit board according to an embodiment includes a substrate, a circuit pattern disposed on the substrate, and a protective layer on the circuit pattern, wherein the substrate includes a chip mounting region, the circuit pattern includes a first circuit pattern and a second circuit pattern connected to a chip of the chip mounting region, the second circuit pattern includes a plurality of second wiring portions and a third pad portion and a fourth pad portion connected to the second wiring portion, the second wiring portion includes a first wiring region connected to the fourth pad portion and a second wiring region bent in the first wiring region, a first space of the first wiring region is greater than a second space of the second wiring region, and a length of the first wiring region is 100 μm or more.

The first space of the first wiring region of the flexible printed circuit board according to the embodiment is 50 μm to 250 μm.

The substrate of the flexible printed circuit board according to the embodiment includes a first bonding region connected to a printed circuit board and a second bonding region connected to the chip disposed in the chip mounting region, and at least a part of the first wiring region and at least a part of the fourth pad portion are disposed in the first bonding region.

The first bonding region of the flexible printed circuit board according to the embodiment includes a first bonding portion on which the protective layer is disposed and a second bonding portion on which the protective layer is not disposed, wherein the first bonding portion is disposed on the first wiring region and the second bonding portion is disposed on the fourth pad portion.

The second wiring portion of the flexible printed circuit board according to the embodiment includes a fourth wiring region electrically connected to the second wiring region and a fifth wiring region bent from the fourth wiring region, wherein the fifth wiring region is connected to the third pad portion, and the second bonding region is disposed on the fifth wiring region and the third pad portion.

The second wiring portion of the flexible printed circuit board according to the embodiment includes a third wiring region bent in the second wiring region, the fourth wiring region bent from the third wiring region, and the fifth wiring region bent in the fourth wiring region, wherein the fifth wiring region is connected to the third pad portion, and the second bonding region is disposed on the fifth wiring region and the third pad portion.

A width of the second wiring portion of the flexible printed circuit board according to the embodiment is reduced while extending from the first wiring region toward the fifth wiring region.

The first space between adjacent first wiring regions of the flexible printed circuit board according to the embodiment is greater than the second space between adjacent second wiring regions, and a ratio of the first space of the first wiring region to the second space of the second wiring region is 1.5:1 to 5:1.

A space of the fourth pad portion of the flexible printed circuit board according to the embodiment is greater than a space of the third pad portion.

The second wiring portion of the flexible printed circuit board according to the embodiment includes a merging portion in which a plurality of fifth wiring regions connected to one fourth wiring region are merged.

At least one dummy pattern is disposed between the merging portions of the flexible printed circuit board according to the embodiment.

The first space of the first wiring region of the flexible printed circuit board according to the embodiment is smaller than a sixth space of the merging portion.

Advantageous Effects

A flexible printed circuit board according to the embodiment can set a space and length of a bonding region of a circuit pattern within a set range.

In detail, in a first bonding region where the circuit pattern and the printed circuit board are connected, a space and length of a wiring region of a wiring portion connected to a pad portion of the first bonding region can be set within a set range.

Accordingly, when a pad portion of the circuit pattern and a terminal of the printed circuit board are connected in the first bonding region, it is possible to inhibit the wiring portions from being conducted by inserting conductive balls of a conductive adhesive between the wiring portions.

That is, the space between the wiring portions in the first bonding region is set to be greater than a diameter of the conductive balls of the conductive adhesive, and accordingly, it is possible to inhibit the wiring portions from being conducted by disposing the conductive adhesive between the wiring portions.

In addition, in a second bonding region where a circuit pattern and a chip are connected, a plurality of wiring regions of the wiring portion connected to the pad portion of the first bonding region may be merged, and a dummy pattern can be disposed between a plurality of merging portions.

Accordingly, in the second bonding region that is relatively smaller in width than the first bonding region, the space of the wiring regions may be maintained and a space of the merging portion may be increased.

Accordingly, when the pad portion of the circuit pattern and a terminal of the chip are connected in the second bonding region, it is possible to inhibit the merging portions from being conducted by inserting the conductive balls of the conductive adhesive between the merging portions.

In addition, in the flexible printed circuit board according to the embodiment, a width of the wiring portion may gradually increase while extending from the chip toward the printed circuit board. Accordingly, it is possible to dispose as many wiring portions as possible in the limited area of the substrate. Therefore, it is possible to reduce the size of the flexible printed circuit board while increasing the wiring density of the flexible printed circuit board.

Therefore, the flexible printed circuit board according to the embodiment may have improved reliability. In addition, since the size of the flexible printed circuit board is reduced, it is possible to form a compact flexible printed circuit board.

DETAILED DESCRIPTION OF THE EMBODIMENTS

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless In detail stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected" or "coupled" to another element, it may include not only when the element is directly "connected" or "coupled"

to other elements, but also when the element is "connected" or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a flexible printed circuit board, a COF module, and an electronic device including the same according to an embodiment will be described with reference to the drawings.

Figure 1A:
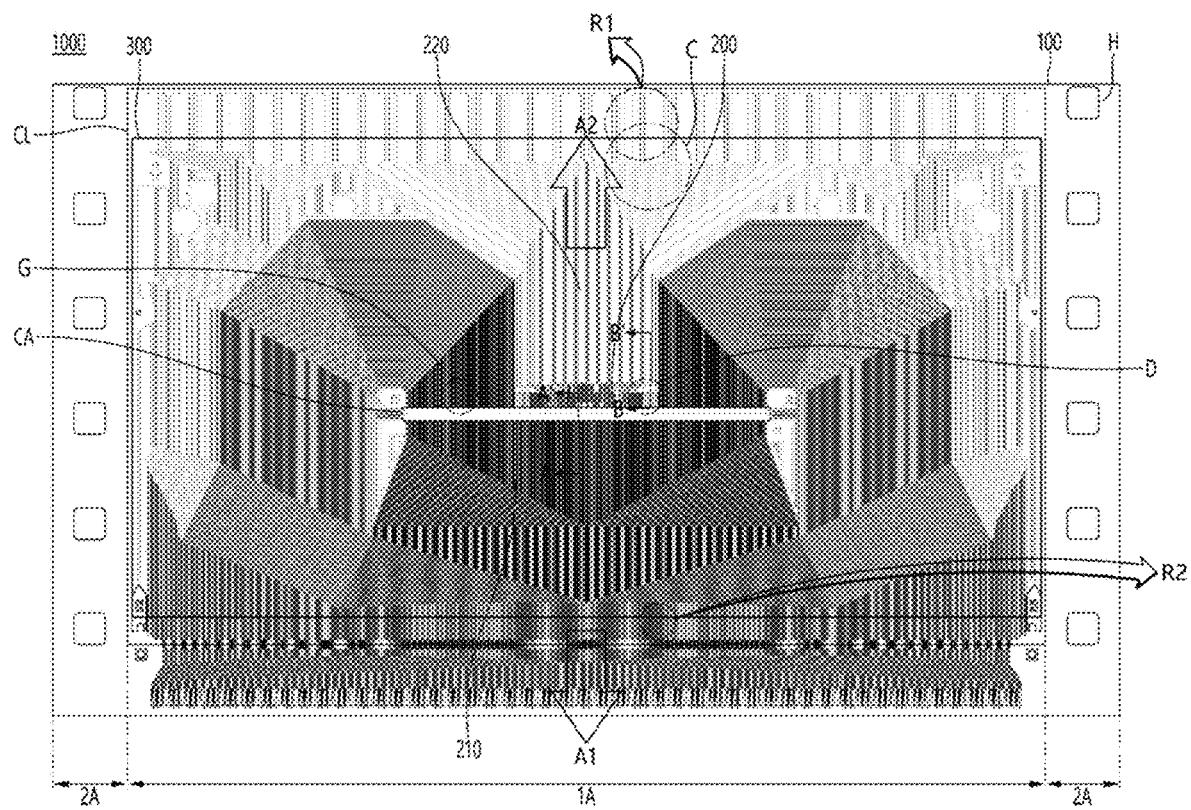
FIG. 1A is atop view of a flexible printed circuit board according to an embodiment.
Figure 1B:
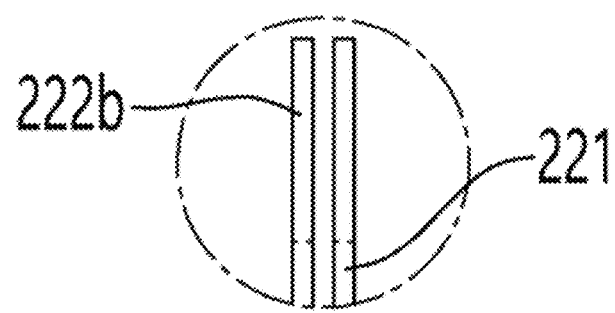
FIG. 1B is an enlarged view of an area R1 of FIG. 1A.
Figure 1C:
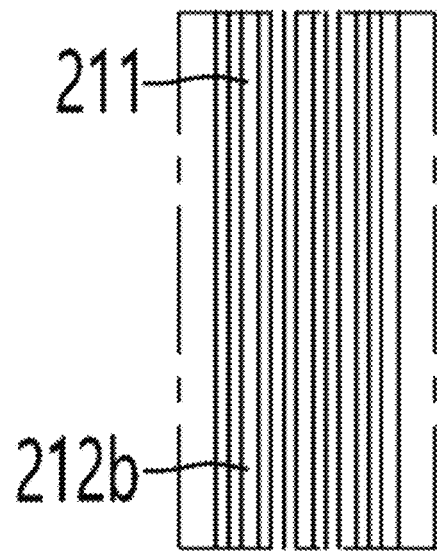
FIG. 1C is an enlarged view of an area R2 of FIG. 1A.

FIG. 1A is a top view of a flexible printed circuit board according to an embodiment, FIG. 1B is an enlarged view of an area R1 of FIG. 1A, and FIG. 1C is an enlarged view of an area R2 of FIG. 1A Referring to FIGS. 1A to 1C, a flexible printed circuit board 1000 according to the embodiment may include a substrate 100 and a circuit pattern 200 disposed on the substrate 100.

The substrate 100 may include a flexible substrate. For example, the substrate 100 may be a polyimide (PI) substrate. However, the embodiment is not limited thereto, and the substrate 100 may include a polymer material such as polyethylene terephthalate (PET), polyethylene naphthalate (PEN), or the like. Accordingly, the flexible printed circuit board including the substrate 100 may be used in various electronic devices having a curved display device. For example, the flexible printed circuit board including the substrate 100 is excellent in flexible characteristics, thereby mounting a semiconductor chip of a wearable electronic device The substrate 100 may have a thickness of 20 μm to 100 μm. For example, the substrate 100 may have a thickness of 25 μm to 50 μm. For example, the substrate 100 may have a thickness of 30 μm to 40 μm. When the thickness of the substrate 100 exceeds 100 μm, the overall thickness of the flexible printed circuit board may be increased. Accordingly, the flexible characteristics may be deteriorated. In addition, when the thickness of the substrate 100 is less than 20 μm, the substrate 100 may be vulnerable to heat/pressure applied to the substrate 100 in a process of mounting a chip.

The substrate 100 may include a first region 1A and a second region 2A. For example, the first region 1A may be a central region of the substrate 100, and the second region 2A may be an outer region of the substrate 100. That is, the first region 1A may be disposed between second regions 2A.

The first region 1A may include a chip mounting region CA. In detail, the first region 1A may include the chip mounting region CA in which a chip C connected to the circuit pattern is mounted.

In addition, circuit patterns 210 and 220 may be disposed on the first region 1A. In detail, a plurality of circuit patterns that are spaced apart from each other and extend in multiple directions may be disposed in the first region 1A.

The first region 1A may be a region actually used in the flexible printed circuit board 1000. That is, when the flexible printed circuit board is in contact with another panel or the like, the first region 1A may be a region that is in contact with the flexible printed circuit board.

The circuit pattern may not be disposed in the second region 2A. That is, the first region 1A and the second region 2A may be divided according to the presence of the arrangement of the circuit pattern.

The second region 2A may include a plurality of holes. In detail, the second region 2A may include a plurality of sprocket holes H. The flexible printed circuit board may be wound or unwound by the sprocket hole H in a roll-to-roll manner.

The second region 2A may be a region not actually used in the flexible printed circuit board 1000. That is, when the flexible printed circuit board is in contact with another panel or the like, the second region may be a region to be removed.

In detail, after cutting a boundary line CL between the second region 2A in which the sprocket hole H is formed and the first region 1A, the flexible printed circuit board 1000 may be processed into the COF module and mounted on various electronic devices.

The circuit pattern may include a wiring portion and a pad portion. In addition, the plurality of circuit patterns may be disposed in the first region 1A. In detail, a first circuit pattern 210 and a second circuit pattern 220 may be disposed in the first region 1A.

Referring to FIGS. 1A, 1B, 1C, 3A, 3B and 3C, the first circuit pattern 210 may include a first wiring portion 211, a first pad portion 212a, and a second pad portion 212b. In detail, the first circuit pattern 210 may include the first pad portion 212a disposed inside the chip mounting region CA, the second pad portion 212b disposed outside the chip mounting region CA, and the first wiring portion 211 disposed between the first pad portion 212a and the second pad portion 212b and connecting the first pad portion 212a and the second pad portion 212b.

The first wiring portion 211, the first pad portion 212a, and the second pad portion 212b may be integrally formed.

In addition, the first wiring portion 211 may be disposed to extend in an A1 direction A1 based on the chip mounting region CA.

The first pad portion 212a may be electrically connected to a chip disposed in the chip mounting region. In addition, the second pad portion 212b may be electrically connected to another printed circuit board. In addition, the first wiring portion 211 may transmit a signal between the chip and the printed circuit board.

A protective layer 300 may be disposed on the first circuit pattern 210. In detail, the protective layer 300 may be disposed on the first wiring portion 211. The protective layer 300 may be disposed to surround the first wiring portion 211. In addition, the protective layer 300 may not be disposed on the first pad portion 212a and the second pad portion 212b.

In addition, referring to FIGS. 1A, 1B, 1C, and 4, the second circuit pattern 220 may include a second wiring portion 221, a third pad portion 222a, and a fourth pad portion 222b. In detail, the second circuit pattern 220 may include the third pad portion 222a disposed inside the chip mounting region CA, the fourth pad portion 222b disposed outside the chip mounting region CA, and the second wiring portion 221 disposed between the third pad portion 222a and the fourth pad portion 222b and connecting the third pad portion 222a and the fourth pad portion 222b.

The second wiring portion 221, the third pad portion 222a, and the fourth pad portion 222b may be integrally formed.

In addition, the second wiring portion 221 may be disposed to extend in an A2 direction A2 based on the chip mounting region CA. In detail, the second wiring portion 221 may be disposed to extend in the A2 direction A2 opposite to the A1 direction A1.

The third pad portion 222a may be electrically connected to the chip disposed in the chip mounting region. In addition, the fourth pad portion 222b may be electrically connected to a display panel. In addition, the second wiring portion 211 may transmit a signal between the chip and the display panel.

The protective layer 300 may be disposed on the second circuit pattern 220. In detail, the protective layer 300 may be disposed on the second wiring portion 221. The protective layer 300 may be disposed to surround the second wiring portion 221. In addition, the protective layer 300 may not be disposed on the third pad portion 222a and the fourth pad portion 222b.

The first circuit pattern 210 and the second circuit pattern 220 may include a metal material having excellent electrical conductivity. In detail, the first circuit pattern 210 and the second circuit pattern 220 may include copper (Cu). However, the embodiment is not limited thereto, and the first circuit pattern 210 and the second circuit pattern 220 may include at least one metal among copper (Cu), aluminum (Al), and chromium (Cr), nickel (Ni), silver (Ag), molybdenum (Mo), gold (Au), titanium (Ti), and alloys thereof.

Hereinafter, a layer structure of the circuit pattern of the flexible printed circuit board according to the embodiment will be described with reference to FIGS. 2A, 2B, 2C, 3A, 3B and 3C. In FIGS. 2A, 2B, 2C, 3A, 3B and 3C, the first circuit pattern 210 is mainly described, but the embodiment is not limited thereto, and the description of the layer structure described in FIGS. 2A, 2B, 2C, 3A, 3B and 3C may also be similarly applied to the second circuit pattern 220.

Figure 2A:
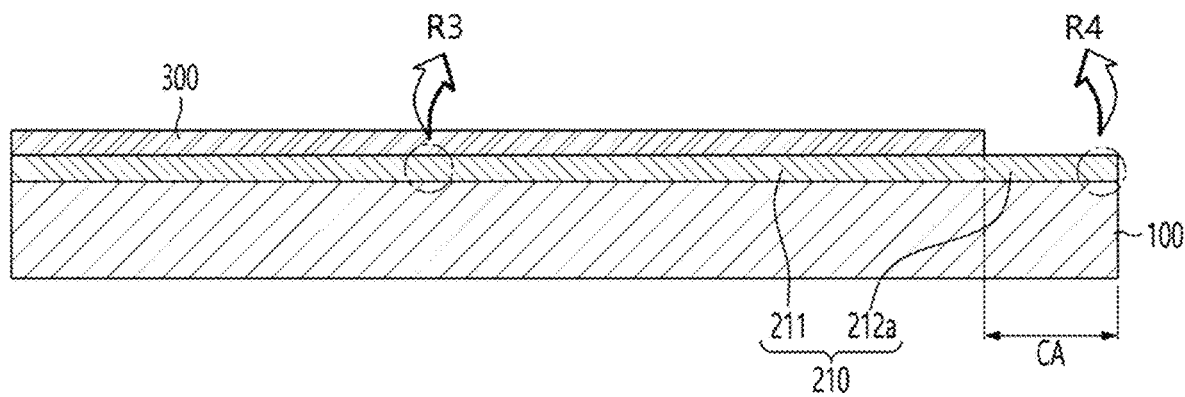
FIGS. 2A and 3A are cross-sectional views taken along line A-A' in FIG. 1A.
Figure 2B:
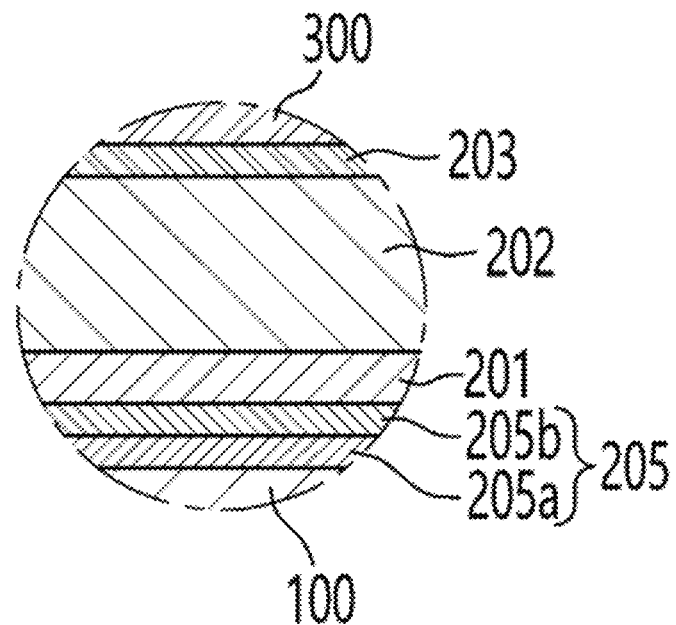
FIG. 2B is an enlarged view of an area R3 of FIG. 2A.
Figure 2C:
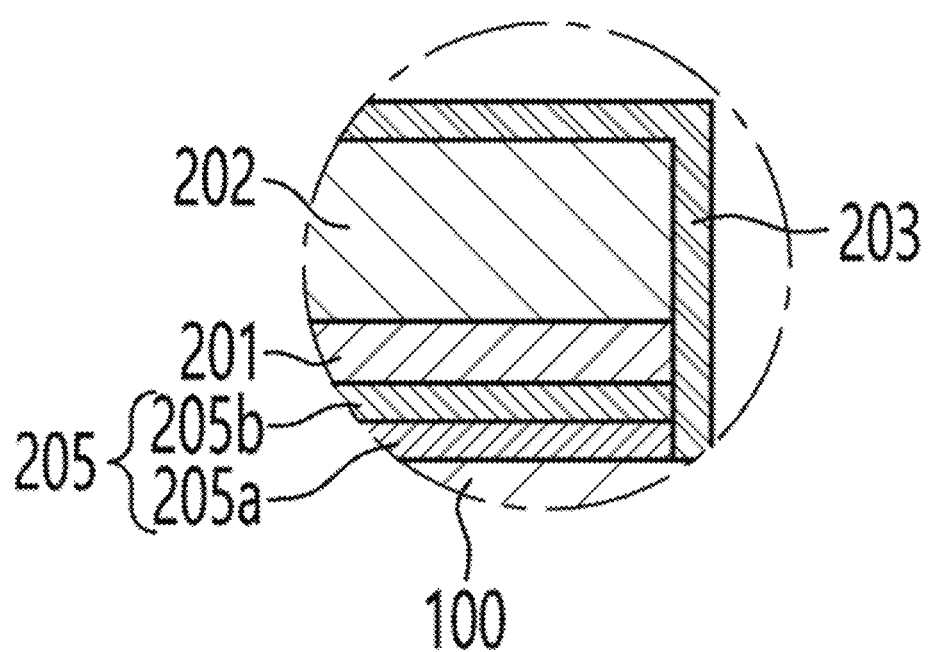
FIG. 2C is an enlarged view of an area R4 of FIG. 2A.

Referring to FIGS. 2A, 2B, and 2C, the first circuit pattern 210 may be formed in multiple layers. In detail, the first wiring portion 211 and the first pad portion 212a may include a first metal layer 201 and a second metal layer 202. In addition, although not shown in FIGS. 2A, 2B, and 2C. The second pad portion 212b may also include the first metal layer 201 and the second metal layer 202.

The first metal layer 201 may be a seed layer of the first circuit pattern 210. In detail, the first metal layer 201 may be a seed layer formed on the substrate 100 through electroless plating using a metal material such as copper (Cu).

In addition, the second metal layer 202 may be a plating layer. In detail, the second metal layer 202 may be a plating layer formed by electrolytic plating using the first metal layer 201 as a seed layer.

A thickness of the first metal layer 201 may be smaller than a thickness of the second metal layer 202.

For example, the thickness of the first metal layer 201 may be 0.7 µm to 2 µm, and the thickness of the second metal layer 202 may be 10 µm to 25 µm.

The first metal layer 201 and the second metal layer 202 may include the same metal material. For example, the first metal layer 201 and the second metal layer 202 may include copper (Cu).

In addition, an adhesive layer 203 may be disposed on the second metal layer 202. In detail, the adhesive layer 203 may be disposed on side surfaces of the first metal layer 201 and the second metal layer 202, and an upper surface of the second metal layer 202. That is, the adhesive layer 203 may be disposed to surround the first metal layer 201 and the second metal layer 202.

The adhesive layer 203 may include a metal. In detail, the adhesive layer 203 may include tin (Sn).

The adhesive layer 203 may be formed in a thickness of 0.3 µm to 0.7 µm. A tin content of the adhesive layer 203 may be increased while extending from a lower surface in which the adhesive layer 203 and the second metal layer 202 are in contact with each other toward an upper surface thereof.

That is, since the adhesive layer 203 is disposed in contact with the second metal layer 202, the tin content may increase and the copper content may decrease from the lower surface of the adhesive layer 203 toward the upper surface thereof.

Accordingly, only pure tin may remain in a thickness range of 0.1 µm to 0.3 µm on the upper surface of the adhesive layer 203.

Terminals of the chip, the printed circuit board, and the display panel may be easily adhered to the first pad portion and the second pad portion through heat and pressure by the adhesive layer 203. That is, when heat and pressure are applied to the first pad portion and the second pad portion, while the upper surface on which pure tin remains in the adhesive layer is melted, the first pad portion and the second pad portion may be easily adhered to the terminals of the chip, the printed circuit board, and the display panel.

Accordingly, the adhesive layer 203 may not be separated from the first pad portion 212a and may become a part of the first pad portion.

The first circuit pattern 210 may be disposed in a thickness of 2 µm to 25 µm. For example, the first circuit pattern 210 may be disposed in a thickness of 5 µm to 20 µm. For example, the first circuit pattern 210 may be disposed in a thickness of 7 µm to 15 µm.

Since the process of etching the first metal layer 201 is performed by flash etching for separating the circuit patterns during the manufacturing process of the first circuit pattern 210, the finally manufactured first circuit pattern 210 and the second circuit pattern 220 may be smaller than a sum of thicknesses of the first metal layer 201, the second metal layer 202, and the adhesive layer 203.

When the thickness of the first circuit pattern 210 and the second circuit pattern 220 is less than 2 µm, the resistance of the first circuit pattern 210 and the second circuit pattern 220 may increase. When the thickness of the first circuit pattern 210 and the second circuit pattern 220 exceeds 25 µm, it may be difficult to implement a fine pattern.

Meanwhile, a buffer layer 205 may be further disposed between the substrate 100 and the first circuit pattern 210 and the second circuit pattern 220. The buffer layer 205 may improve adhesion between the substrate 100 and the first circuit pattern 210 and the second circuit pattern 220, which are dissimilar materials.

The buffer layer 205 may be formed in multiple layers. In detail, a first buffer layer 205a and a second buffer layer 205b on the first buffer layer 205a may be disposed on the substrate 100. Accordingly, the first buffer layer 205a may be in contact with the substrate 100, and the second buffer layer 205b may be disposed in contact with the first circuit pattern 201.

The first buffer layer 205a may include a material having good adhesion to the substrate 100. For example, the first buffer layer 205a may include nickel (Ni). In addition, the second buffer layer 205b may include a material having good adhesion to the first circuit pattern 210. For example, the second buffer layer 205b may include chromium (Cr).

The buffer layer 205 including the first buffer layer 205a and the second buffer layer 205b may have a thin film thickness in a nanometer unit. For example, the buffer layer 205 may have a thickness of 20 nm or less.

The adhesion between the substrate 100 and the first circuit pattern 210 which are dissimilar materials may be improved by the buffer layer 205, thereby preventing delamination of the first circuit pattern 201.

Figure 3A:
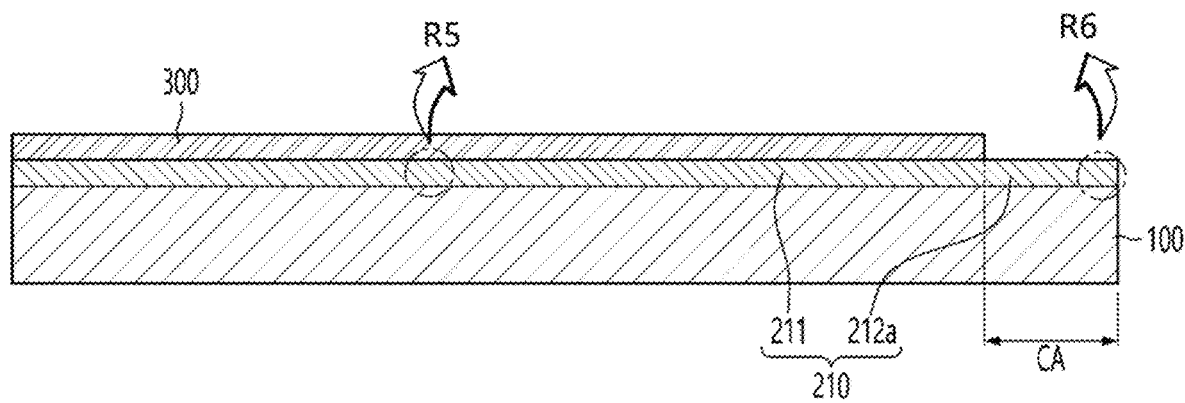
Figure 3B:
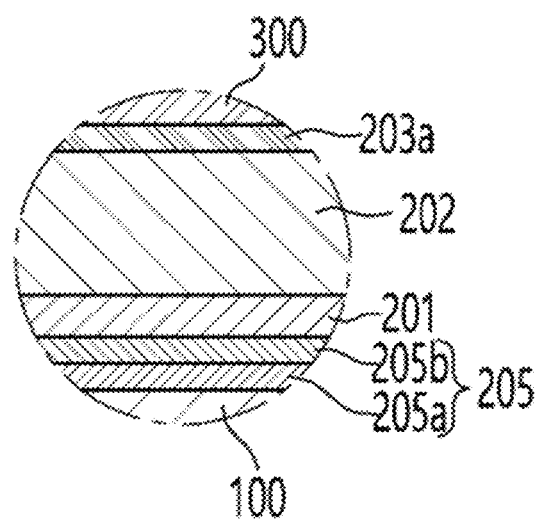
FIG. 3B is an enlarged view of an area R5 of FIG. 3A.
Figure 3C:
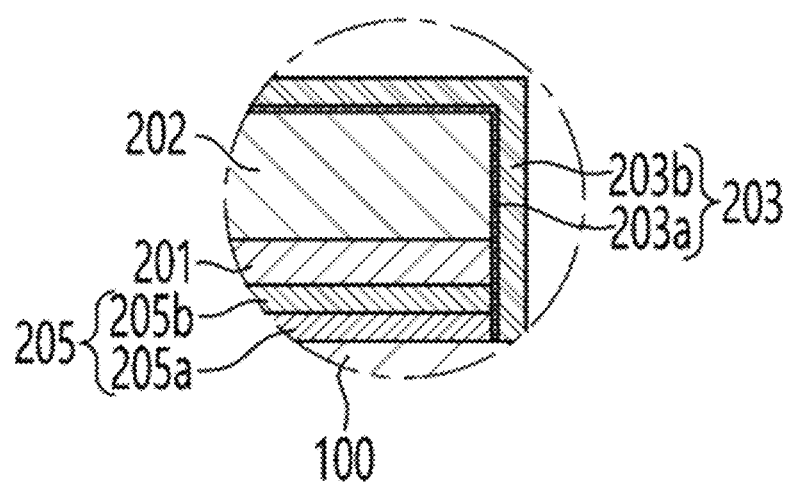
FIG. 3C is an enlarged view of an area R6 of FIG. 3A.
Figure 4:
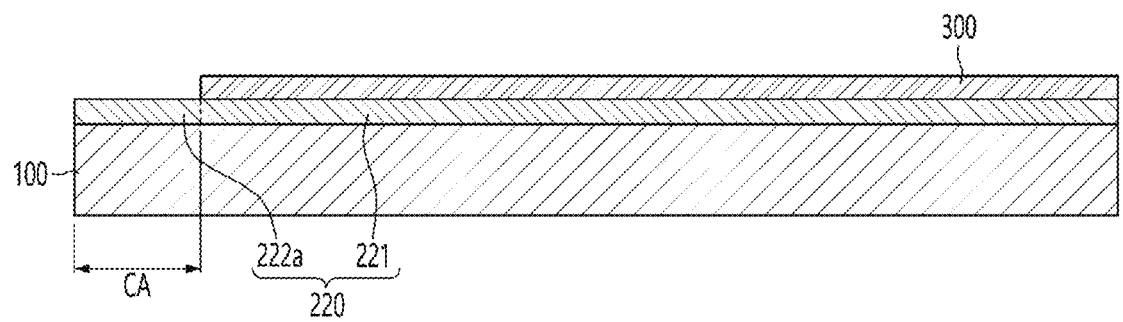
FIG. 4 is a cross-sectional view taken along line B-B' in FIG. 1A.

Meanwhile, referring to FIGS. 3A, 3B and 3C, the adhesive layer 203 may include a first adhesive layer 203a and a second adhesive layer 203b.

In detail, the first adhesive layer 203a may be disposed on the first wiring portion 211 and the first pad portion 212a. In addition, although not shown in the drawing, the first adhesive layer 203a may also be disposed on the second pad portion 212b. That is, the first adhesive layer 203a may be disposed on the first circuit pattern 210.

In addition, the second adhesive layer 203b may be disposed only on the first pad portion 212a and the second pad portion 212b. That is, the first wiring portion 211, the first pad portion 212a, and the second pad portion 212b may have different layer structures due to the second adhesive layer 203b.

The first adhesive layer 203a and the second adhesive layer 203b may include a metal. In detail, the first adhesive layer 203a and the second adhesive layer 203b may include tin (Sn).

The first adhesive layer 203a and the second adhesive layer 203b may be disposed to have different thicknesses. In detail, a thickness of the second adhesive layer 203b may be greater than a thickness of the first adhesive layer 203a.

For example, the first adhesive layer 203a may have a thin film thickness of 0.02 μm to 0.06 m, and the second adhesive layer 203b may have a thickness of 0.2 μm to 0.6 m.

When the adhesive layer is thickly disposed between the protective layer 300 and the first wiring portion 211, cracks may occur when the flexible printed circuit board is bent. Accordingly, by forming the first adhesive layer 231 between the protective layer 300 and the first wiring portion 211 to have a thin film thickness, it is possible to inhibit cracks from occurring when the flexible printed circuit board is bent.

In addition, the second adhesive layer 203b may have a higher tin content while extending from a lower surface in which the second adhesive layer 203b and the first adhesive layer 203a are in contact with each other toward an upper surface thereof.

That is, in the second adhesive layer 203b, the tin content may increase and the copper content may decrease from the lower surface of the second adhesive layer 203b toward the upper surface thereof.

Accordingly, only pure tin may remain in a thickness range of 0.1 μm to 0.3 μm on an upper surface of the second adhesive layer 203b.

Terminals of the chip, the printed circuit board, and the display panel may be easily adhered to the first pad portion and the second pad portion through heat and pressure by the second adhesive layer 203b. That is, when heat and pressure are applied to the first pad portion and the second pad portion, while the upper surface on which pure tin remains in the adhesive layer is melted, the first pad portion and the second pad portion may be easily adhered to the terminals of the chip, the printed circuit board, and the display panel.

Accordingly, the first adhesive layer 203a and the second adhesive layer 203b may not be separated from the first pad portion 212a and may become a part of the first pad portion.

Meanwhile, the protective layer 300 may be disposed on the wiring portions of the first circuit pattern 210 and the second circuit pattern 220. In detail, the protective layer 300 may be disposed to surround the first wiring portion 211 and the second wiring portion 221. That is, the protective layer 300 may be disposed on the first circuit pattern 210 and the second circuit pattern 220 except for the first pad portion, the second pad portion, the third pad portion, and the fourth pad portion.

The protective layer 300 may include solder paste. For example, the protective layer 300 may include a solder paste including a thermosetting resin, a thermoplastic resin, a filler, a curing agent, or a curing accelerator.

Hereinafter, the second circuit pattern of the flexible printed circuit board will be described in detail with reference to FIGS. 5 and 6.

As described above, the second circuit pattern 220 may include the second wiring portion 221. The second wiring portion 221 may connect the third pad portion 222a and the fourth pad portion 222b between the third pad portion 222a and the fourth pad portion 222b. That is, the second wiring portion 221 may be disposed to extend from the third pad portion 222a toward the fourth pad portion 222b.

In this case, the second circuit pattern 220 may be disposed to extend in various directions on the first region 1A of the substrate 100 in order to minimize an arrangement area of the second wiring portion 221. That is, the second wiring portion 221 may be disposed to extend in a plurality of directions instead of one direction from the third pad portion 222a toward the fourth pad portion 222b. Accordingly, the second wiring portion 221 may be efficiently disposed on a limited region of the substrate 100. Therefore, more second circuit patterns 220 may be disposed on the flexible printed circuit board, and a size of the flexible printed circuit board may be reduced.

Figure 5:
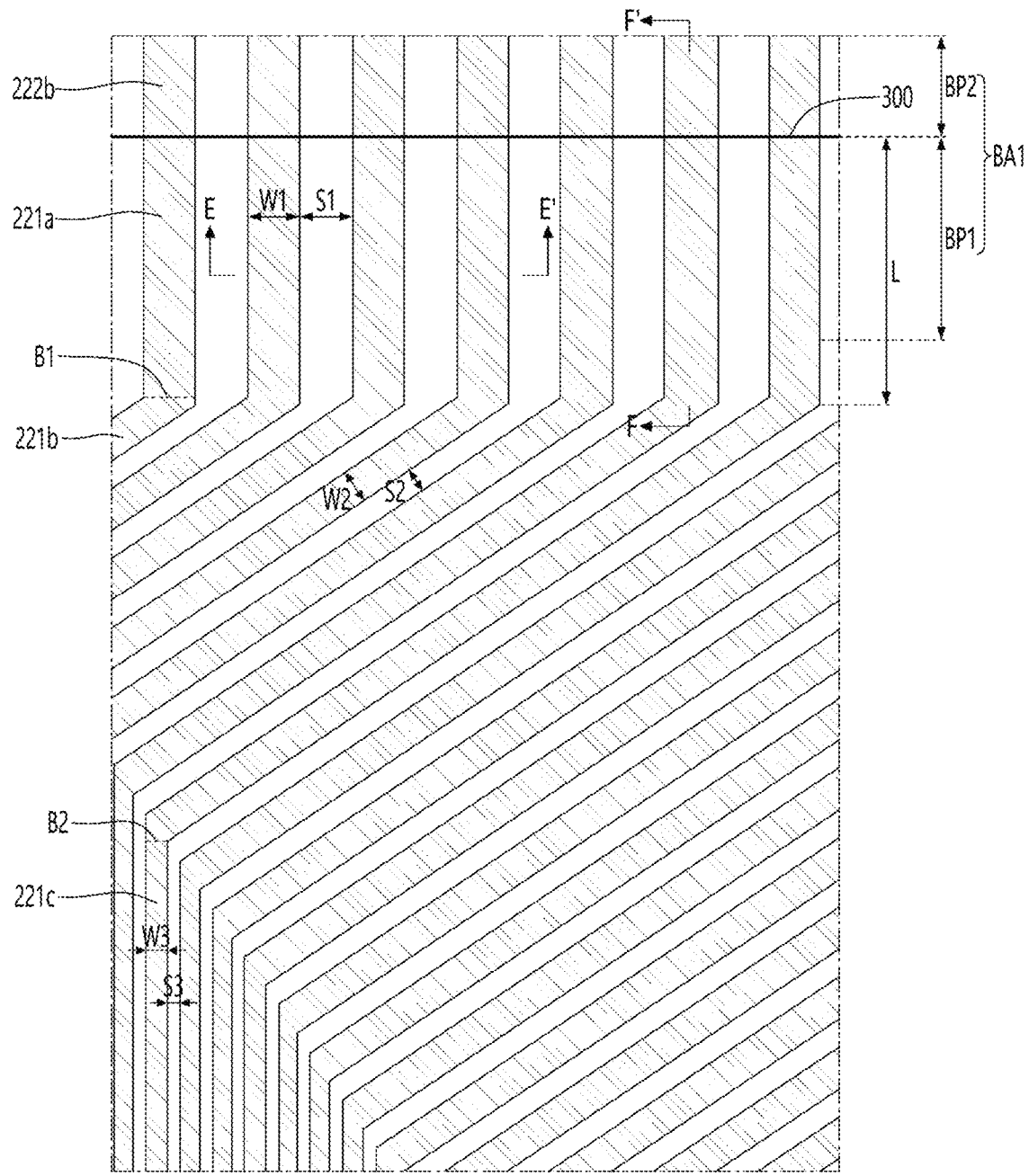
FIG. 5 is an enlarged view of region C in FIG. 1A.

FIG. 5 is an enlarged view of a region C in FIG. 1A. In detail, FIG. 5 is a view illustrating a second wiring portion disposed far from the chip C in the flexible printed circuit board. That is, FIG. 5 is a view illustrating the second wiring portion 221 adjacent to the fourth pad portion 222b.

Figure 6:
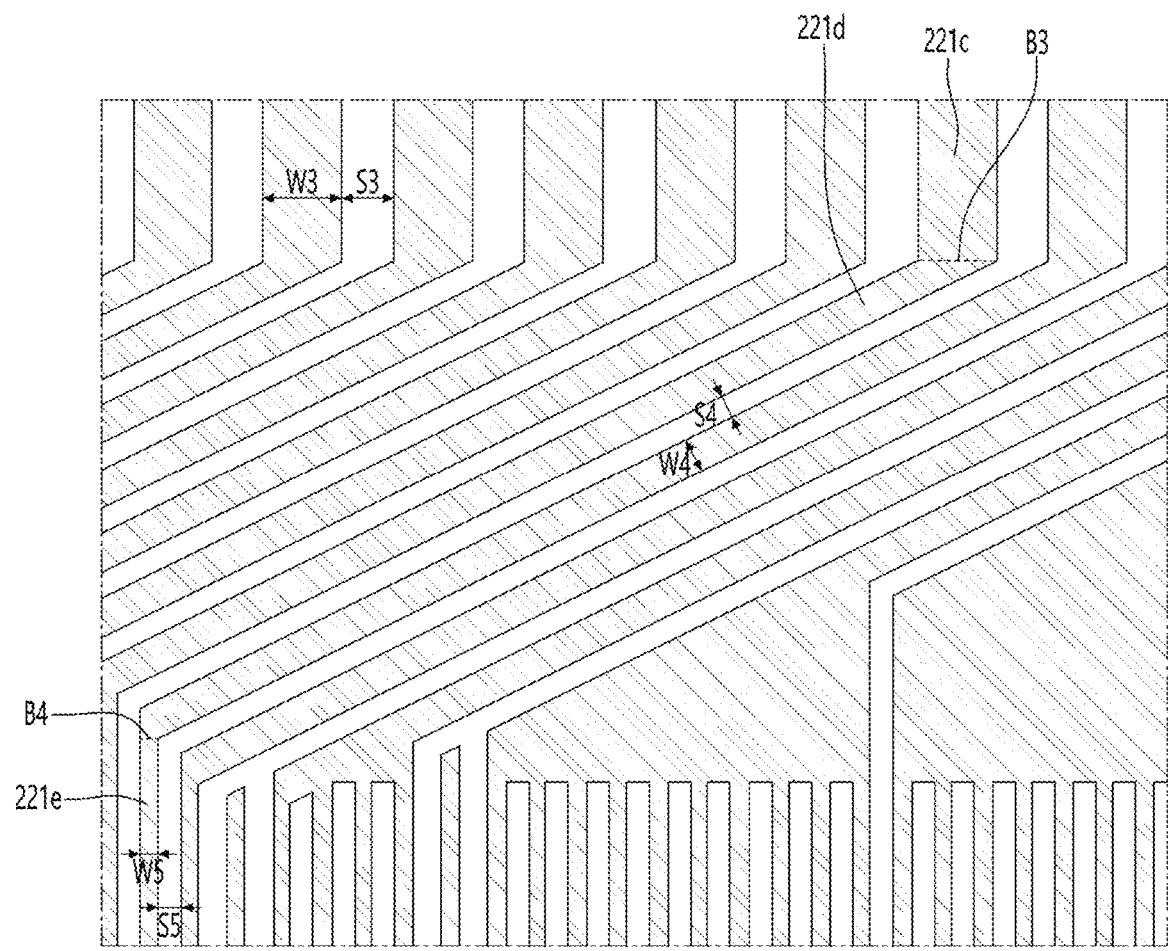
FIG. 6 is an enlarged view of region D in FIG. 1A.

In addition, FIG. 6 is an enlarged view of a region D in FIG. 1A. In detail, FIG. 6 is a view illustrating a second wiring portion disposed close to the chip C in the flexible printed circuit board. That is, FIG. 6 is a view illustrating the second wiring portion 221 adjacent to the third pad portion 222a.

Referring to FIGS. 5 and 6, the second wiring portion 221 may include a first wiring region 221a, a second wiring region 221b, a third wiring region 221c, a fourth wiring region 221d, and a fifth wiring region 221e.

The first wiring region 221a may be a wiring region directly connected to the fourth pad portion 222b. In addition, the fifth wiring region 221e may be a wiring region directly connected to the third pad portion 222a.

The first wiring region 221a, the second wiring region 221b, the third wiring region 221c, the fourth wiring region 221d, and the fifth wiring region 221e may extend in different directions from each other.

In detail, any two of the first wiring region 221a, the second wiring region 221b, the third wiring region 221c, the fourth wiring region 221d, and the fifth wiring region 221e may extend in a direction different from the other three wiring regions.

For example, the first wiring region 221a may extend in a first direction D1. The first direction D1 may be defined as the same direction as a width direction of the substrate 100.

For example, when a long width direction of the substrate 100 is defined as a transverse direction and a short width direction is defined as a longitudinal direction, the first direction may be defined as the same direction as the short width direction. Accordingly, the first wiring region 221a may extend in the short width direction of the substrate 100.

In addition, the second wiring region 221*b* may extend in a second direction D2. The second direction D1 may be defined as a direction different from the width direction of the substrate 100. That is, the second direction D2 may be defined as a direction different from the long width direction and the short width direction of the substrate 100. For example, the second direction D2 may be defined as a diagonal direction between the long width direction and the short width direction. Accordingly, the second wiring region 221*b* may extend in a diagonal direction of the substrate 100.

In addition, the third wiring region 221*c* may extend in the same direction as the first wiring region 221*a*. In detail, the third wiring region 221*c* may extend in the first direction D1. Accordingly, the third wiring region 221*c* may extend in the short width direction of the substrate 100.

In addition, the fourth wiring region 221*d* may extend in the same direction as the second wiring region 221*b*. In detail, the fourth wiring region 221*d* may extend in the second direction D2. Accordingly, the fourth wiring region 221*d* may extend in the diagonal direction of the substrate 100.

In addition, the fifth wiring region 221*e* may extend in the same direction as the first wiring region 221*a*. In detail, the fifth wiring region 221*e* may extend in the first direction D1. Accordingly, the fifth wiring region 221*e* may extend in the short width direction of the substrate 100.

Meanwhile, five wiring regions in which the second wiring portion 221 is bent and extends in different directions are illustrated in the drawings, but the embodiment is not limited thereto, and the second wiring portion 221 may include more than five wiring regions or less than five wiring regions.

For example, in the second wiring portion 221, any one wiring region may be omitted, and the second wiring portion 221 may include the first wiring region 221*a* connected to the fourth pad portion 222*b*, the second wiring region 221*b* bent in the first wiring region 221*a*, the fourth wiring region 221*d* bent in the second wiring region 221*b*, and the fifth wiring region 221*e* bent in the fourth wiring region 221*d*.

Since the first wiring region 221*a*, the second wiring region 221*b*, the third wiring region 221*c*, the fourth wiring region 221*d*, and the fifth wiring region 221*e* extend in different directions, boundaries between the first wiring region 221*a*, the second wiring region 221*b*, the third wiring region 221*c*, the fourth wiring region 221*d*, and the fifth wiring region 221*e* may be formed.

That is, a first boundary B1 between the first wiring region 221*a* and the second wiring region 221*b* may be defined as a region where a direction of the second portion 221 is changed between the first wiring region 221*a* and the second wiring region 221*b*. That is, the first boundary B1 may be defined as a region where the second wiring portion 221 is bent between the first wiring region 221*a* and the second wiring region 221*b*.

In addition, a second boundary B2 between the second wiring region 221*b* and the third wiring region 221*c* may be defined as a region where the direction of the second portion 221 is changed between the second wiring region 221*b* and the third wiring region 221*c*. That is, the second boundary B2 may be defined as a region where the second wiring portion 221 is bent between the second wiring region 221*b* and the third wiring region 221*c*.

In addition, a third boundary B3 between the third wiring region 221*c* and the fourth wiring region 221*d* may be defined as a region where the direction of the second portion 221 is changed between the third wiring region 221*c* and the fourth wiring region 221*d*. That is, the third boundary B3 may be defined as a region where the second wiring portion 221 is bent between the third wiring region 221*c* and the fourth wiring region 221*d*.

In addition, a fourth boundary B4 between the fourth wiring region 221*d* and the fifth wiring region 221*e* may be defined as a region where the direction of the second portion 221 is changed between the fourth wiring region 221*d* and the fifth wiring region 221*e*. That is, the fourth boundary B4 may be defined as a region where the second wiring portion 221 is bent between the fourth wiring region 221*d* and the fifth wiring region 221*e*.

That is, the second wiring portion 221 may include the first wiring region 221*a* directly connected to the fourth pad portion 222*b*, the second wiring region 221*b* bent in the first wiring region 221*a*, the third wiring region 221*c* bent in the second wiring region 221*b*, the fourth wiring region 221*d* bent in the third wiring region 221*c*, and the fifth wiring region 221*e* bent in the fourth wiring region 221*d*.

The first wiring region 221*a*, the second wiring region 221*b*, the third wiring region 221*c*, the fourth wiring region 221*d*, and the fifth wiring region 221*e* may have different sizes from each other. In detail, the first wiring region 221*a*, the second wiring region 221*b*, the third wiring region 221*c*, the fourth wiring region 221*d*, and the fifth wiring region 221*e* may be formed with different widths from each other.

In detail, a first width w1 of the first wiring region 221*a* may be greater than a second width w2 of the second wiring region 221*b*, a third width w3 of the third wiring region 221*c*, a fourth width w4 of the fourth wiring region 221*d*, and a fifth width w5 of the fifth wiring region 221*e*. In addition, the second width w2 of the second wiring region 221*b* i may be greater than the third width w3 of the third wiring region 221*c*, the fourth width w4 of the fourth wiring region 221*d*, and the fifth width w5 of the fifth wiring region 221*e*. In addition, the third width w3 of the third wiring region 221*c* may be greater than the fourth width w4 of the fourth wiring region 221*d* and the fifth width w5 of the fifth wiring region 221*e*. In addition, the fourth width w4 of the fourth wiring region 221*d* and the fifth width w5 of the fifth wiring region 221*e* may be the same or similar.

That is, a width of the second wiring portion 221 may increase while extending from the third pad portion 222*a* toward the fourth pad portion 222*b*. In other words, the width of the second wiring portion 221 may decrease while extending from the fourth pad portion 222*b* toward the third pad portion 222*a*.

For example, the first width w1 of the first wiring region 221*a* may be 100 μm or more. In detail, the first width w1 of the first wiring region 221*a* may be 100 μm to 200 μm. In more detail, the first width w1 of the first wiring region 221*a* may be 120 μm to 180 μm.

In addition, the second width w2 of the second wiring region 221*b* may be less than 100 μm. In detail, the second width w2 of the second wiring region 221*b* may be 30 μm to 90 μm. In more detail, the second width w2 of the second wiring region 221*b* may be 25 μm to 75 μm.

In addition, the third width w3 of the third wiring region 221*c* may be less than 100 μm. In detail, the third width w3 of the third wiring region 221*c* may be 20 μm to 70 μm. In more detail, the third width w3 of the third wiring region 221*c* may be 15 μm to 25 μm.

In addition, the fourth width w4 of the fourth wiring region 221*d* and the fifth width w5 of the fifth wiring region 221*e* may be less than 100 μm. In detail, the fourth width w4 of the fourth wiring region 221*d* and the fifth width w5 of the fifth wiring region 221*e* may be 10 μm to 50 μm. In more detail, the fourth width w4 of the fourth wiring region 221d and the fifth width w5 of the fifth wiring region 221e may be 5 μm to 15 μm.

The first wiring region 221a, the second wiring region 221b, the third wiring region 221c, the fourth wiring region 221d, and the fifth wiring region 221e extend in different directions from each other, and the widths of the wiring regions extend while changing between the third pad portion 222a and the fourth pad portion 222b. Accordingly, the flexible printed circuit board may reduce an area in which the second wiring portion is disposed on the substrate 100.

That is, the second wiring portions 221 are disposed in different directions and different widths for each region. Accordingly, more second wiring portions 221 may be disposed in the same area. Therefore, it is possible to minimize an increase in a size of the flexible printed circuit board 1000 by the second wiring portion 221.

Meanwhile, the second wiring portion 221 may include a bonding region and a non-bonding region.

As described above. The third pad portion 222a of the second circuit pattern 220 may be electrically connected to a printed circuit board of another component, and the fourth pad portion 222b may be electrically connected to the chip C. Accordingly, the second wiring portion 221 may transmit a signal between the chip and the printed circuit board.

In order to electrically connect the second circuit pattern 220 and the chip C, the third pad portion 222a and a terminal of the chip C should be electrically connected. In addition, in order to electrically connect the second circuit pattern 220 and the printed circuit board, the fourth pad portion 222b and a terminal of the printed circuit board should be electrically connected.

For example, the third pad portion 222a and the terminal of the chip C may be electrically connected to each other through a conductive adhesive such as an anisotropic conductive film (ACF), and the fourth pad portion 222b and the terminal of the printed circuit board may be electrically connected to each other through the conductive adhesive such as the anisotropic conductive film (ACF).

That is, the chip C and the printed circuit board may be electrically connected through the second circuit pattern 220 by disposing the conductive adhesive between the third pad portion 222a and the terminal of the chip C and between the fourth pad portion 222b and the terminal of the printed circuit board.

The conductive adhesive may be disposed on the third pad portion 222a and the fourth pad portion 222b. In addition, the conductive adhesive may be disposed in a part or the entire region of the fifth wiring region 221e connected to the third pad portion 222a and the first wiring region 2211 connected to the fourth pad portion 222b.

That is, the bonding region and the non-bonding region may be divided according to whether the conductive adhesive is disposed. In detail, a region where the conductive adhesive is disposed may be defined as the bonding region, and a region where the conductive adhesive is not disposed may be defined as the non-bonding region.

Meanwhile, the conductive adhesive may include a conductive ball for conductivity of the conductive adhesive. In this case, the conductive ball having a predetermined diameter may be inserted between the second wiring portions.

Figure 7:
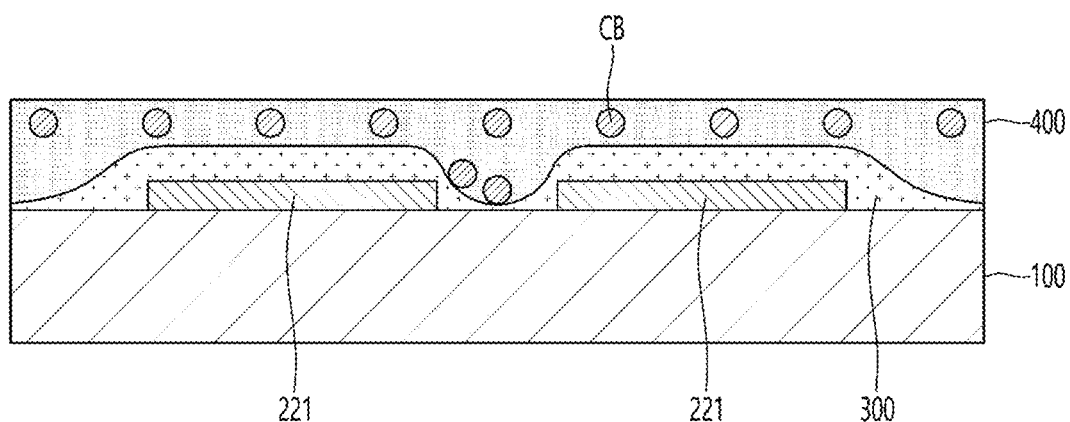
FIG. 7 is a view illustrating a cross-sectional view in which conductive balls are inserted between second wiring portions of the flexible printed circuit board according to the embodiment.
Figure 8:
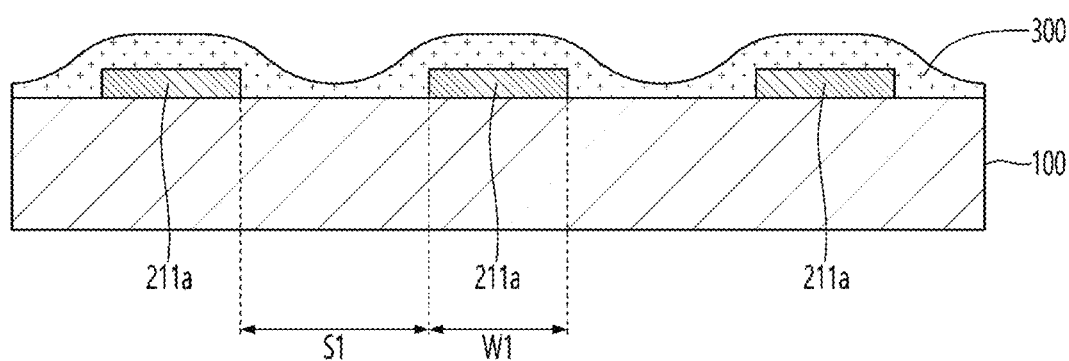
FIG. 8 is a cross-sectional view taken along line E-E' in FIG. 5.
Figure 9:
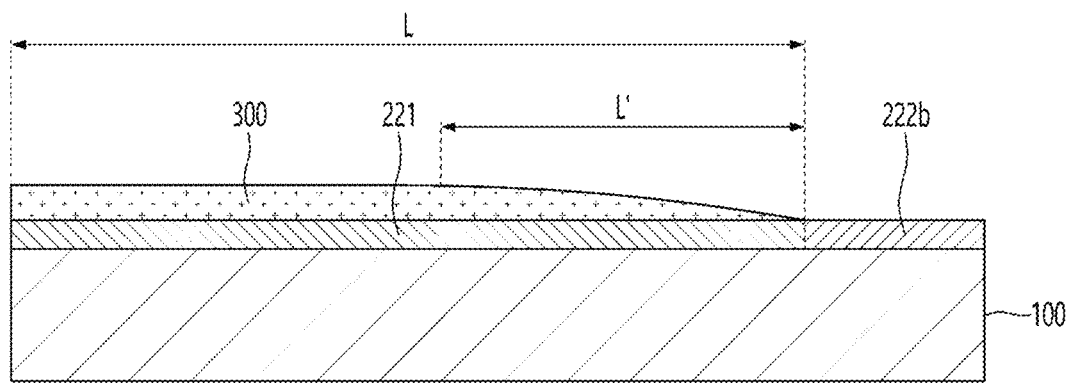
FIG. 9 is a cross-sectional view taken along line F-F' in FIG. 5.

FIG. 7 is a view for describing a problem when conductive balls of the conductive adhesive are inserted between the second wiring portions.

Referring to FIG. 7, the above-described protective layer 300 may be disposed on the second wiring portion 221. Since the protective layer 300 is disposed to surround the second wiring portion 221, the protective layer 300 may be disposed between the second wiring portions 221.

In this case, the protective layer disposed between the second wiring portions 221 may not completely fill a space between the second wiring portions 221 due to a step difference and may fill with a certain inclination angle. In addition, the protective layer may be disposed while exposing one surface of the substrate 100.

Accordingly, a thickness of the protective layer 300 exposed through between the second wiring portions 221 and disposed on a side surface of the second wiring portion 221 may be disposed to have a relatively small thickness compared to a thickness of the protective layer 300 disposed on the second wiring portion 221. In addition, the protective layer 300 may be disposed on only a part of the side surface of the second wiring portion 221 exposed through between the second wiring portions 221 due to a process error, or the protective layer 300 may not be disposed on all of the side surfaces of the second wiring portion 221.

Accordingly, when a space between the second wiring portions is smaller than or similar to a diameter of a conductive ball CB, when a conductive adhesive 400 is disposed on the protective layer 300, the conductive ball CB may be inserted between the wiring portions.

Accordingly, the adjacent second wiring portions may be short-circuited by being conducted with each other. Thus, the reliability of the flexible printed circuit board may be deteriorated.

In order to solve the above problems, in the flexible printed circuit board according to the embodiment, a space of the second wiring portion 221 may be different for each region. In addition, a length of the specific region of the second wiring portion 221 may be set within a set range. In addition, the specific region of the second wiring portion 221 may be merged.

A part or entire first wiring region 221a and a part or entire fifth wiring region 221e among the regions of the second wiring portion 221 may be defined as the bonding region. In addition, the second wiring region 221b, the third wiring region 221c, and the fourth wiring region 221d may be defined as the non-bonding region.

In detail, apart or entire fifth wiring region 221e directly connected to the third pad portion 222a may be defined as a bonding region BA. In more detail, a part or entire fifth wiring region 221e directly connected to the third pad portion 222a may be defined as the bonding region BA.

In addition, a part or entire first wiring region 221a directly connected to the fourth pad portion 222b may be defined as the bonding region BA. In more detail, a part or entire first wiring region 221a directly connected to the fourth pad portion 222b may be defined as the bonding region BA.

Hereinafter, the first wiring region 221a directly connected to the fourth pad portion 222b may be defined as a first bonding region BA1, and the fifth wiring region 222e directly connected to the third pad portion 222a may be defined as a second bonding region BA2.

That is, the first bonding region BA1 may be a part or entire first wiring region 221a, and the second bonding region BA2 may be a part or entire fifth wiring region 221e.

The first bonding region BA1 may be defined as two regions depending on whether the protective layer 300 is disposed. In detail, the first bonding region BA1 may include the first bonding portion BP1 and the second bonding portion BP2. The protective layer 300 may be disposed on the first bonding portion BP1. In addition, the protective layer 300 may not be disposed on the second bonding portion BP2.

Accordingly, the conductive adhesive may be disposed in both a region where the protective layer is disposed in the first bonding portion BP1 and a region where the protective layer is not disposed in the second bonding portion BP2.

The second bonding portion BP2 may be disposed on the fourth pad portion 222b. The second bonding portion BP2 may be disposed on a part or entire fourth pad portion 222b. That is, the protective layer 300 may not be disposed on the fourth pad portion 222b.

In addition, the first bonding portion BP1 may be disposed on the first wiring region 221a. The first bonding portion BP1 may be disposed on a part or entire first wiring region 221a. That is, the protective layer 300 may be disposed on the first wiring region 221a.

Alternatively, the first wiring region 221a may be disposed on the first bonding portion BP1 and the second bonding portion BP2. That is, a part of the first wiring region 221a may be disposed on the first bonding portion BP1, and the other part may be disposed on the second bonding portion BP2. That is, the protective layer 300 may be disposed on a part of the first wiring region 221a, and the protective layer 300 may not be disposed on the other part of the first wiring region 221a.

The second bonding region BA2 may be defined as two regions depending on whether the protective layer 300 is disposed. In detail, the second bonding region BA2 may include the third bonding portion BP3 and the fourth bonding portion BP4. The protective layer 300 may be disposed on the third bonding portion BP3. In addition, the protective layer 300 may not be disposed on the fourth bonding portion BP4.

Accordingly, the conductive adhesive disposed in the second bonding region BA2 may be disposed in both the region where the protective layer is disposed and the region where the protective layer is not disposed in the second bonding region BA2.

The fourth bonding portion BP4 may be disposed on the third pad portion 222a. That is, the protective layer 300 may not be disposed on the third pad portion 222a.

In addition, the third bonding portion BP3 may be disposed on the fifth wiring region 221e. That is, the protective layer 300 may be disposed on the fifth wiring region 221e.

Alternatively, the fifth wiring region 221e may be disposed on the third bonding portion BP3 and the fourth bonding portion BP4. That is, a part of the fifth wiring region 221e may be disposed on the third bonding portion BP3, and the other part may be disposed on the fourth bonding portion BP4. That is, the protective layer 300 may be disposed on a part of the fifth wiring region 221e, and the protective layer 300 may not be disposed on and the other part of the fifth wiring region 221e.

In addition, the second wiring region 221b, the third wiring region 221c, and the fourth wiring region 221d, which are disposed between the first wiring region 221a and the fourth wiring region 221b, may be defined as a non-bonding region. In detail, all of the second wiring region 221b, the third wiring region 221c, and the fourth wiring region 221d which are disposed between the first wiring region 221a and the fourth wiring region 221b may be defined as a non-bonding region NBA.

First, the first wiring region 221a directly connected to the fourth pad portion 222b will be described with reference to FIGS. 5, 6, 8 and 9.

Referring to 5, 6, 8, and 9, the first wiring region 221a may have a space within a set range from the adjacent first wiring region 221a. In detail, a first space s1 of the first wiring region 221a may be 50 µm or more. In detail, the first space s1 of the first wiring region 221a may be 50 µm to 250 µm. In more detail, the first space s1 of the first wiring region 221a may be 100 µm to 200 µm.

Since the fourth pad portion 222b is integrally formed with the first wiring region 221a, a space of the fourth pad portion 222b may be the same as or similar to that of the first wiring region 221a.

The set range of the first space s1 of the first wiring region 221a is a range considered to inhibit short circuiting of the first wiring regions 221a in the first wiring region 221a that is a bonding region. In detail, when the first space s1 of the first wiring region 221a is less than 50 µm, conductive balls CB of the conductive adhesive 400 between the first wiring regions may conduct the first wiring regions between the first wiring regions. Accordingly, the reliability of the flexible printed circuit board may be deteriorated.

In addition, when the first space s1 of the first wiring region 221a exceeds 250 µm, the space between the fourth pad portions 222b also increases by increasing a space between the first wiring regions, so that a width of the bonding region may increase. Accordingly, the size of the flexible printed circuit board is increased together, and a component to which the flexible printed circuit board is applied may be limited due to the increase in the size of the flexible printed circuit board.

The first space s1 of the first wiring region 221a may be greater than a space of other wiring regions. In detail, the first space s1 of the first wiring region 221a may be greater than a second space s2 of the second wiring region 221b, a third space s3 of the third wiring region 221c, a fourth space s4 of the fourth wiring region 221d, and a fifth space s5 of the fifth wiring region 221e.

In detail, the second space s2, the third space s3, the fourth space s4, and the fifth space s5 may be less than 50 µm. In more detail, the second space s2, the third space s3, the fourth space s4, and the fifth space s5 may be 10 µm to 50 µm. In more detail, the second space s2, the third space s3, the fourth space s4, and the fifth space s5 may be 20 µm to 40 µm. The second space s2, the third space s3, the fourth space s4, and the fifth space s5 may be formed in the same or different spaces within the set space range.

When the second space s2, the third space s3, the fourth space s4, and the fifth space s5 exceed 50 µm, it is difficult to dispose all of a plurality of wiring portions in a limited area, and thus the size of the flexible printed circuit board may increase. In addition, when the second space s2, the third space s3, the fourth space s4, and the fifth space s5 are less than 10 µm, the second wiring portion 221 is short-circuited due to a process or a process error, and thus the reliability of the flexible printed circuit board may be deteriorated.

In addition, the first wiring region 221a may have a set length range. A length L of the first wiring region 221a may be defined as a length from the first boundary B1 to the fourth pad portion 222b.

In detail, the length L of the first wiring region 221a may be 100 µm or more. In detail, the length L of the first wiring region 221a may be 150 µm or more. In more detail, the length L of the first wiring region 221a may be 100 µm to 300 µm.

A set range of the length L of the first wiring region 221a is a range in which a size of the bonding region and the prevention of a short circuit of the second wiring portions are considered. In detail, when the length L of the first wiring region 221*a* is less than 100 µm, the length of the first wiring region 221*a*, which is the bonding region, is short, so that a sufficient amount of the conductive adhesive may not be applied, and thus a connection failure between the second circuit pattern and the printed circuit board may occur. In addition, the conductive adhesive may flow down to the second wiring region 221*b* having a small space between the wiring regions in order to apply a sufficient amount of the conductive adhesive, so that the adjacent second wiring portions may be conducted by the conductive balls of the conductive adhesive.

In addition, when the length L of the first wiring region 221*a* exceeds 300 µm, the size of the bonding region is unnecessarily increased, and thus the overall size of the flexible printed circuit board may be increased.

In addition, a length L' of the first bonding portion BP1 may be less than or equal to the length L of the first wiring region 221*a*. That is, when the first bonding portion BP1 is disposed on a part of the first wiring region 221*a*, the length L' of the first bonding portion BP1 may be smaller than the length L of the first wiring region 221*a*, and when the first bonding portion BP1 is disposed on entire first wiring region 221*a*, the length L' of the first bonding portion BP1 may be the same as the length L of the first wiring region 221*a*.

In addition, the length L of the first wiring region 221*a* may be greater than the first space s1 of the first wiring region 221*a*. In detail, the length L of the first wiring region 221*a* may have a size ratio of a set ratio with respect to the first space s1 of the first wiring region 221*a*.

For example, the length L of the first wiring region 221*a* may be 100 times or less with respect to the first space s1 of the first wiring region 221*a*. In detail, the length L of the first wiring region 221*a* may be 10 to 100 times the first space s1 of the first wiring region 221*a*. In more detail, the length L of the first wiring region 221*a* may be 30 to 80 times the first space s1 of the first wiring region 221*a*. In more detail, the length L of the first wiring region 221*a* may be 40 to 70 times the first space s1 of the first wiring region 221*a*.

Figure 11:
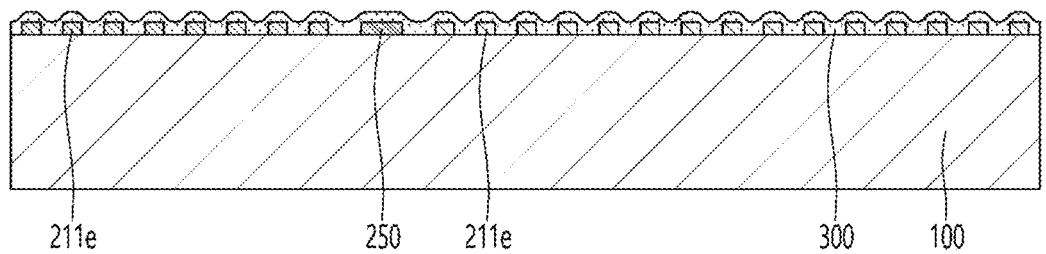
FIG. 11 is a cross-sectional view taken along line H-H' in FIG. 10.
Figure 12:
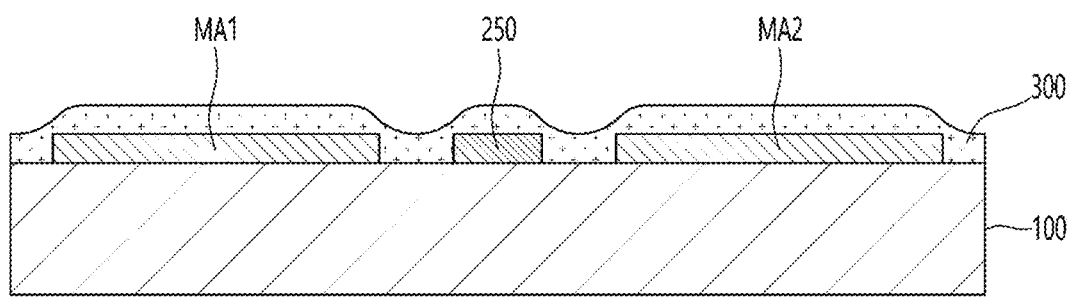
FIG. 12 is a cross-sectional view taken along line I-I' in FIG. 10.

Hereinafter, the fifth wiring region 221*e* directly connected to the third pad portion 222*a* will be described with reference to FIGS. 10 to 12.

Figure 10:
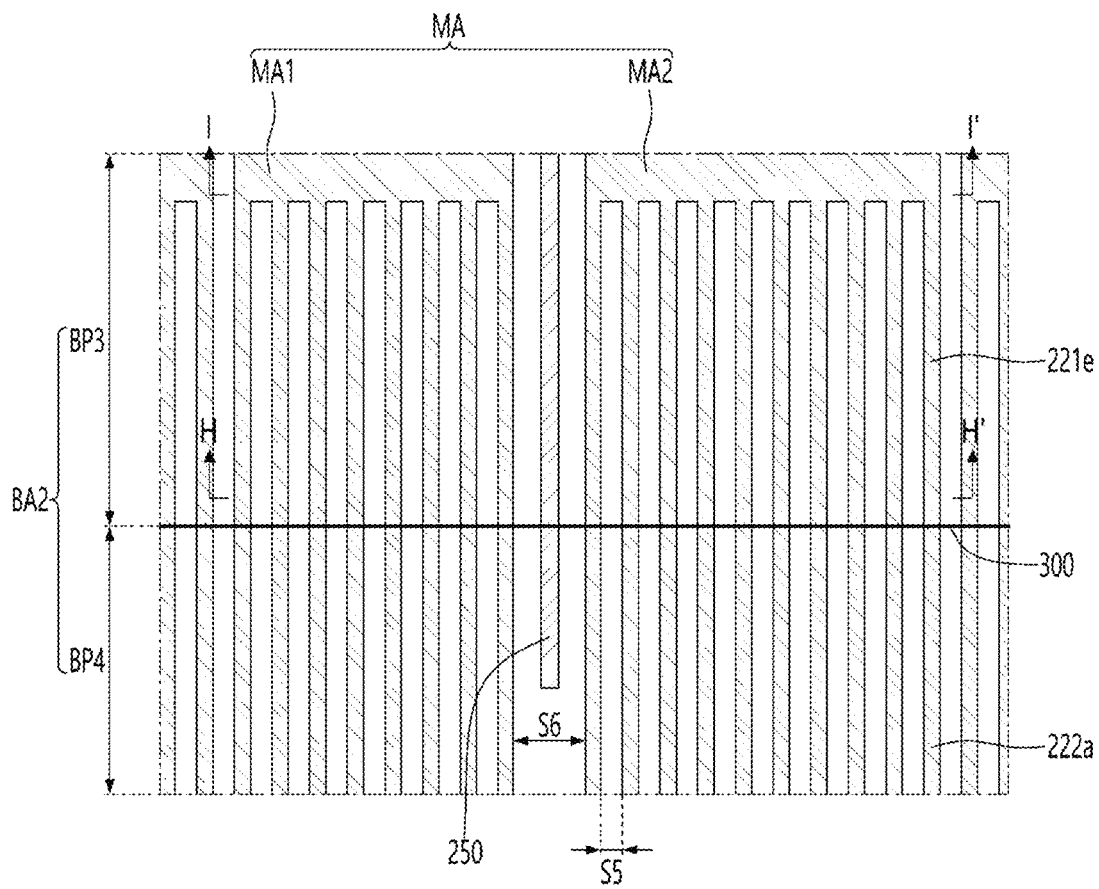
FIG. 10 is an enlarged view of region G in FIG. 1A.

Referring to FIG. 10, the fifth wiring region 221*e* may include a merging portion MA. In detail, the fifth wiring region 221*e* may include the merging portion MA in which a plurality of fifth wiring regions 221*e* are merged. That is, since the plurality of fifth wiring regions 221*e* are merged in the merging portion MA, a plurality of third pad portions 222*a* may be included.

A plurality of merging portions MA may be disposed in the second bonding region BA2 in which the third pad portion 222*a* and the fifth wiring region 221*e* are disposed. For example, a first merging portion MA1 and a second merging portion MA2 may be disposed in the second bonding region BA2.

The reliability of the flexible printed circuit board may be improved by the merging portion MA. In detail, even when distances between the terminals of the chip are different, the space between the pad portions may be maintained by the merging portion, so that it is possible to improve the uniformity of the width and/or thickness of the circuit due to a space difference when forming the wiring electrode. Alignment between the terminal of the chip and the terminal of the flexible printed circuit board may be efficiently controlled, thereby improving process efficiency and productivity.

The number of the fifth wiring regions 221*e* and the third pad portions 222*a* included in the first merging portion MA1 and the number of the fifth wiring region 221*e* and the third pad portions 222*a* included in the second merging portion MA2 may be the same or similar to each other.

In addition, a dummy pattern 250 may be disposed between the first merging portion MA1 and the second merging portion MA2. The second bonding region BA2 may inhibit the merging portions from being conducted due to the conductive adhesive disposed between the merging portions by sufficiently securing a space between the first merging portion MA1 and the second merging portion MA2 by the dummy pattern 250. The dummy pattern 250 may not be connected to the chip.

The fifth space s5 of the fifth wiring region 221*e* disposed in the second bonding region BA2 and the first space s1 of the first wiring region 221A disposed in the first bonding region BA1 may be different from each other. In detail, the fifth space s5 may be smaller than the first space s1.

Accordingly, a space s5' of the third pad portions 222*a* disposed in the second bonding region BA2 may also be smaller than the space of the fourth pad portions 222*b* disposed in the first bonding region BA1. The space s5' of the third pad portion 222*a* may correspond to the fifth space s5 of the fifth wiring region 221*e*. That is, the space s5' of the third pad portion 222*a* may be the same as or similar to the fifth space s5 of the fifth wiring region 221*e*.

In addition, a sixth space s6 between the merging portions disposed in the second bonding region BA2 and the first space s1 of the first wiring region 221*a* disposed in the first bonding region BA1 may be different from each other. In detail, the sixth space s6 may be greater than the first space s1.

Accordingly, the sixth space s6 may also be greater than the space of the fourth pad portion 222*b* disposed in the first bonding region BAL.

That is, in the flexible printed circuit board according to the embodiment, the wiring regions disposed in each of the bonding regions having different sizes may be disposed with different lengths, spaces, and shapes.

In detail, in the first bonding region BA1 having a relatively large bonding region, the space of the first wiring regions 221*a* may be greater than the space of the fifth wiring regions 221*e* of the second bonding region BA2.

In addition, in the first bonding region BA1, when the length of the first wiring region 221*a* having a relatively large space is set to a set range to bond the fourth pad portion 222*b* and the printed circuit board with a conductive adhesive, it is possible to inhibit the adjacent second wiring portions 221 from being conducted by the conductive balls.

In addition, since the size of the bonding region is limited in the second bonding region BA2, the merging portion for merging the plurality of fifth wiring regions 221*e* may be formed and the dummy pattern may be disposed between the merging portions while maintaining the space between the fifth wiring regions 221*e*. Accordingly, when the third pad portion 222*a* and the chip are bonded with the conductive adhesive, it is possible to inhibit the adjacent merging portions from being conducted by the conductive balls.

Figure 13:
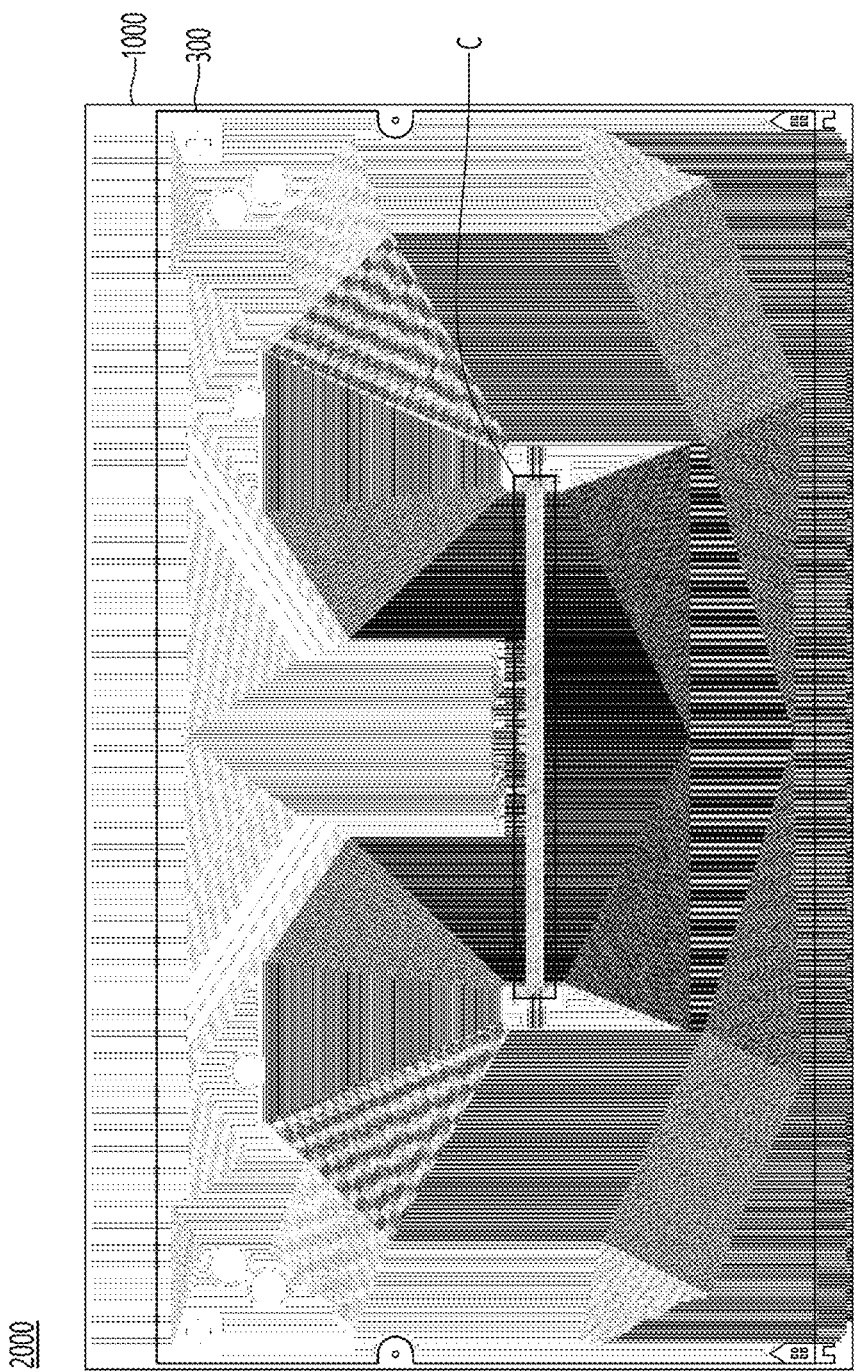
FIG. 13 is a top view of a COF module according to an embodiment.

FIG. 13 is a view illustrating a top view of a COF module according to an embodiment.

Referring to FIG. 13, the COF module according to the embodiment may include the flexible printed circuit board described above and the chip C disposed in the chip mounting region CA of the flexible printed circuit board 1000.

In addition, the flexible printed circuit board 1000 may include the above-described protective layer 300.

Meanwhile, the COF module may be manufactured by cutting the second region 2A of the flexible printed circuit board 1000 and then mounting the chip C. In detail, after cutting the boundary line CL between the first region 1A and the second region 2A of FIG. 1A, a COF module 2000 may be manufactured, in which a driving chip electrically connected to the first circuit pattern and the second circuit pattern and disposed in the chip mounting region of the flexible printed circuit board is mounted.

For example, after testing driving characteristics of the flexible printed circuit board through the wiring and the pad disposed outside the boundary line CL of the flexible printed circuit board, the flexible printed circuit board may be cut along the boundary line CL.

The COF module may be positioned between the display panel and the substrate to connect an electrical signal.

That is, pad portions of the first circuit pattern and the second circuit pattern that are exposed without the protective layer 300 being disposed may be connected to the display panel and the printed circuit board, and the third circuit pattern in the chip mounting region may be connected to the chip.

Figure 14:
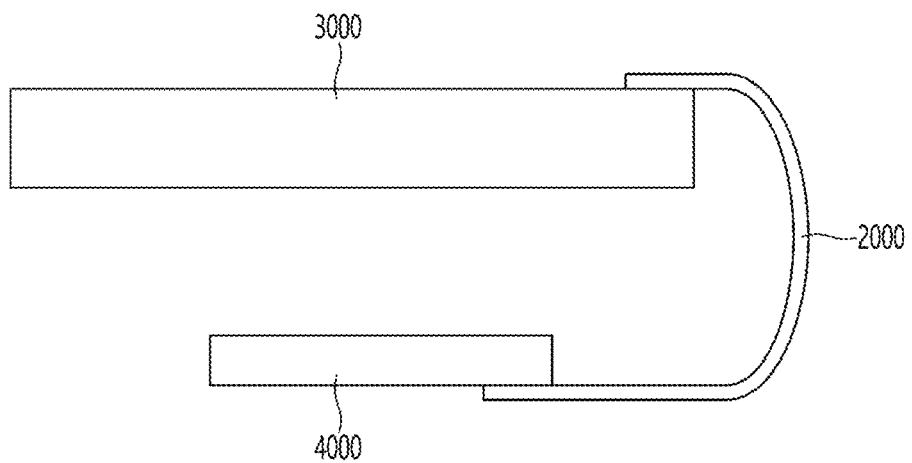
FIG. 14 is a cross-sectional view illustrating a connection relationship of the COF module including the flexible printed circuit board according to the embodiment.

Referring to FIG. 14, one end of the COF module 2000 including the flexible printed circuit board according to the embodiment may be connected to a display panel 3000, and the other end opposite to the one end may be connected to a printed circuit board 4000.

For example, one end of the COF module 2000 including the flexible printed circuit board according to the embodiment may be electrically connected by being in contact with the display panel 3000, and the other end opposite to the one end may be electrically connected by being in contact with the printed circuit board 4000. Here, the contact may refer to a direct contact. Alternatively, it may refer to contacting with an anisotropic conductive film (ACF) interposed therebetween.

As an example, the ACF may be disposed between the COF module 2000 and the printed circuit board 4000. The COF module 2000 and the printed circuit board 4000 may be electrically connected while being adhered by the ACF. The ACF may be a resin in which conductive particles are dispersed. Therefore, the electrical signal connected by the printed circuit board 4000 may be transmitted to the COF module 2000 through the conductive particles included in the ACF.

Since the COF module 2000 includes a flexible substrate, it may have a rigid shape or a bent shape between the display panel 3000 and the printed circuit board 4000.

The COF module 2000 may connect between the display panel 3000 and the printed circuit board 4000 disposed opposite to each other in a bent shape, thereby reducing a thickness of the electronic device and improving the degree of freedom in design. In addition, since the COF module 2000 including the flexible substrate may not be disconnected even in the bent shape, the reliability of the electronic device including the COF module may be improved.

Since the COF module is flexible, it may be used in various electronic devices.

Figure 15:
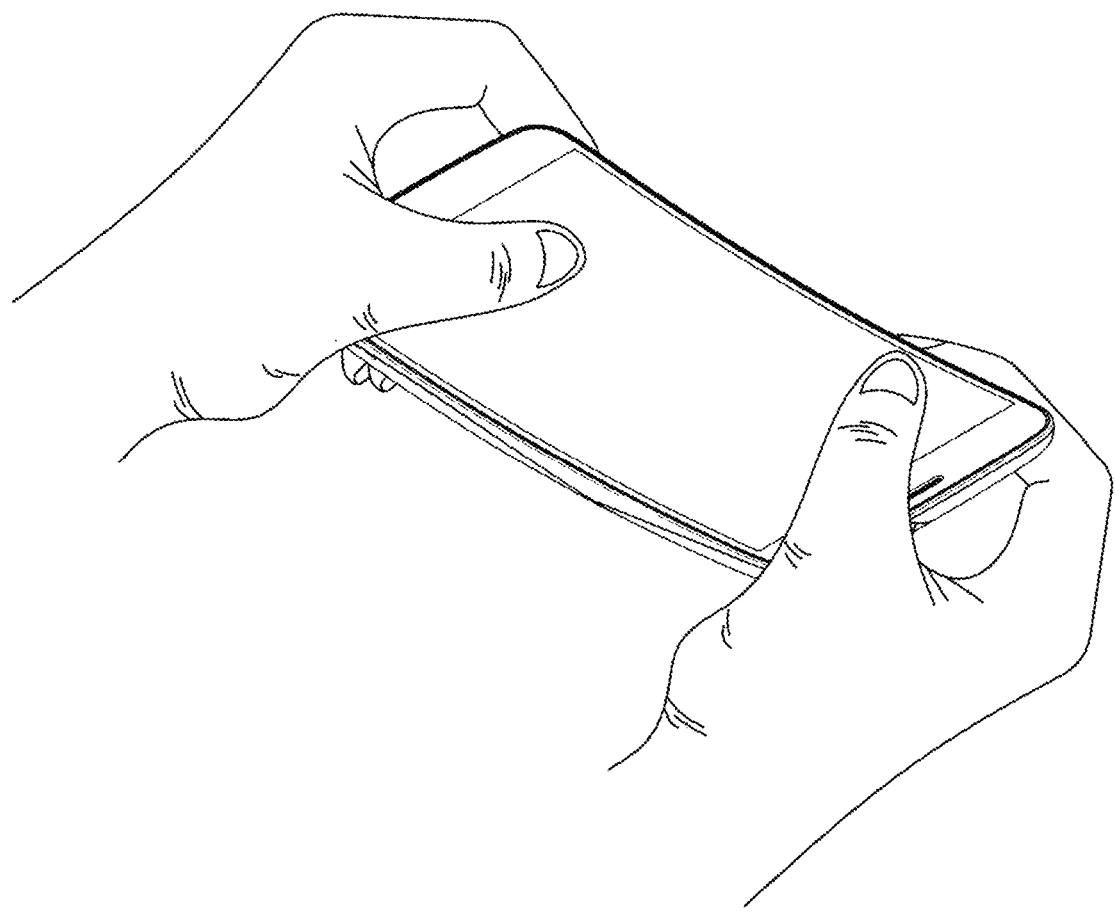
FIGS. 15 to 17 are views of an electronic device including the flexible printed circuit board according to the embodiment.

For example, referring to FIG. 15, the COF module may be included in a bendable flexible touch window. Therefore, a touch device including the same may be a flexible touch device. Therefore, a user may bend or fold it by hand. Such a flexible touch window may be applied to a wearable touch or the like.

Figure 16:
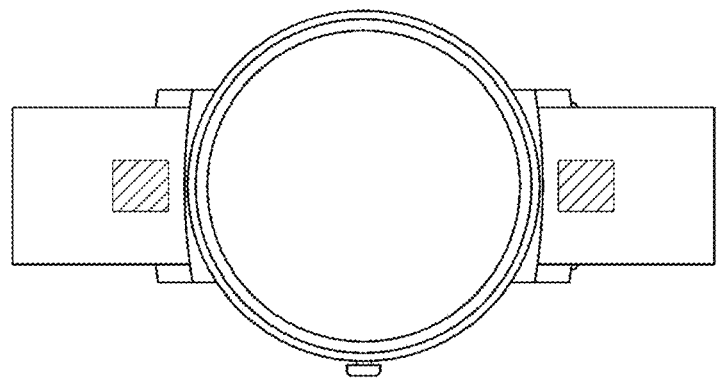

Referring to FIG. 16, the COF module may be included in various wearable touch devices including a curved display. Therefore, an electronic device including the COF module may be reduced in thickness or weight.

Figure 17:
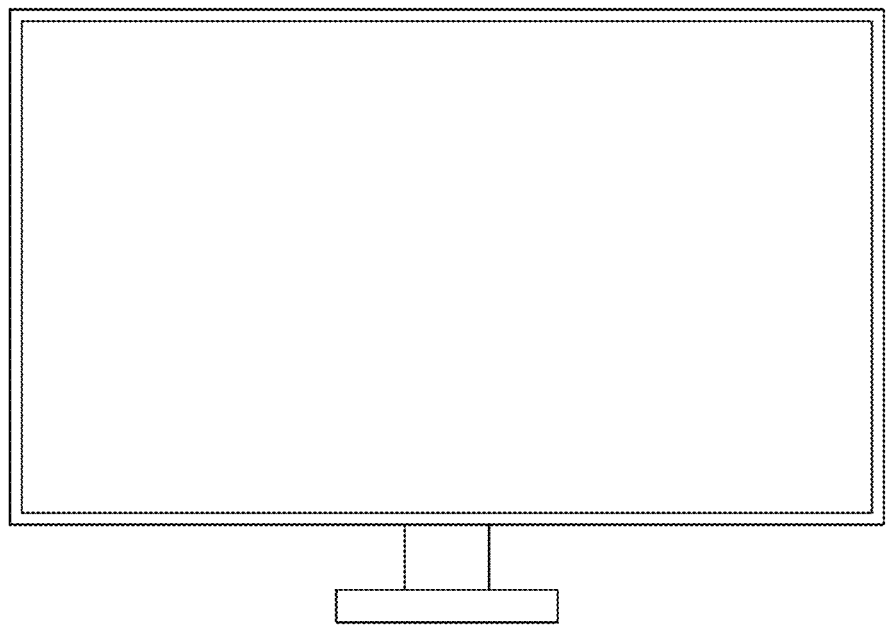

Referring to FIG. 17, the COF module may be used for various electronic devices having a display portion such as a TV, a monitor, and a laptop. In this case, the COF module may be used for an electronic device having a curved-shaped display portion However, the embodiment is not limited thereto, and of course, such a COF flexible printed circuit board and a COF module obtained by processing the same may be used for various electronic devices.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component In detail represented in the embodiments may be varied. In addition, it should be construed that differences related to such a variation and such an application are included in the scope of the present disclosure defined in the following claims.

What is claimed is:

1. A flexible printed circuit board comprising: a substrate; a circuit pattern disposed on the substrate; and a protective layer disposed on the circuit pattern, wherein the substrate includes a chip mounting region, wherein the circuit pattern includes a first circuit pattern extending toward a first side of the substrate from the chip mounting region, and a second circuit pattern extending toward a second side of the substrate from the chip mounting region, wherein the second circuit pattern includes a plurality of wiring portions and an inner pad portion and an outer pad portion both connected to the plurality of wiring portions, wherein the plurality of wiring portions include a first region connected to the inner pad portion and a second region connected to the first region, wherein a merging portion is provided between the first region and the second region and merges a plurality of first regions and one second region, wherein the merging portion includes a first merging portion and a second merging portion spaced apart from each other, and wherein a dummy pattern is disposed between the first merging portion and the second merging portion, and wherein the plurality of wiring portions include a plurality of third regions connected to the outer pad portion, and a plurality of fourth regions bent from the plurality of third regions, respectively, and wherein a first space between adjacent third regions is greater than a second space between adjacent fourth regions, and a length of each third region is 100 um or more.

2. The flexible printed circuit board of claim 1, wherein a length of the first space is in a range between 50 um to 250 um.

3. The flexible printed circuit board of claim 1, wherein the substrate includes a first bonding region connected to a printed circuit board and a second bonding region connected to a chip disposed in the chip mounting region, and wherein at least a part of the third region and at least a part of the outer pad portion are disposed in the first bonding region.

4. The flexible printed circuit board of claim 3, wherein the first bonding region includes a first bonding portion on which the protective layer is disposed and a second bonding portion on which the protective layer is not disposed,
- wherein the first bonding portion is disposed on the third region, and
- wherein the second bonding portion is disposed on the outer pad portion.

5. The flexible printed circuit board of claim 1, wherein the second bonding region is disposed on the first region and the inner pad portion.

6. The flexible printed circuit board of claim 5, wherein the plurality of wiring portions decrease in width from the outer pad portion toward the inner pad portion.

7. The flexible printed circuit board of claim 6, wherein a width of the third region is in a range between 100 μm and 200 μm, and
- wherein a width of the fourth region is in a range between 10 μm and 50 μm.

8. The flexible printed circuit board of claim 1, wherein the first to fourth regions are integrally formed.

9. The flexible printed circuit board of claim 1, wherein a length of the third region is between 10 to 100 times that of the first space.

10. The flexible printed circuit board of claim 6, wherein a length of the second space is in a range between 20 μm and 40 μm.

11. The flexible printed circuit board of claim 1, wherein a length of the third region is in a range between 100 um and 300 um.

12. The flexible printed circuit board of claim 1, wherein a ratio of the first space to the second space is in a range between 1.5:1 and 5:1.

13. The flexible printed circuit board of claim 1, wherein the outer pad portion comprises a plurality of outer pad portions, wherein the inner pad portion comprises a plurality of inner pad portions, and wherein a space between adjacent outer pad portions is greater than a space between adjacent inner pad portion.

14. The flexible printed circuit board of claim 1, wherein one side surface of the dummy pattern is positioned directly facing the first merging portion, and another side of the dummy pattern is positioned directly facing the second merging portion.

15. The flexible printed circuit board of claim 1, wherein the first space is smaller than a space between the first merging portion and the second merging portion.

16. A chip on film (COF) module comprising:
- the flexible printed circuit board according to claim 1; and
- a chip disposed in the chip mounting region.

17. An electronic device comprising:
- the COF module according to claim 16;
- a display panel connected to the first circuit pattern; and
- a printed circuit board connected to the second circuit pattern.

* * * * *